(12) United States Patent
Ido et al.

(10) Patent No.: US 7,034,406 B2
(45) Date of Patent: Apr. 25, 2006

(54) SEMICONDUCTOR DEVICE WITH ALIGNMENT MARK

(75) Inventors: Yasuhiro Ido, Hyogo (JP); Takeshi Iwamoto, Hyogo (JP); Kazushi Kono, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 13 days.

(21) Appl. No.: 10/870,976

(22) Filed: Jun. 21, 2004

(65) Prior Publication Data

US 2004/0262783 A1 Dec. 30, 2004

(30) Foreign Application Priority Data

Jun. 27, 2003 (JP) ............................. 2003-184117

(51) Int. Cl.
*H01L 23/544* (2006.01)
(52) U.S. Cl. ...................................... 257/797; 438/462
(58) Field of Classification Search ................. 257/797; 438/462
See application file for complete search history.

(56) References Cited

U.S. PATENT DOCUMENTS 5,528,372 A * 6/1996 Kawashima ................. 356/401
6,858,948 B1 * 2/2005 Van Haren .................. 257/797

FOREIGN PATENT DOCUMENTS

JP 7-335721 12/1995
JP 2001-168194 A 6/2001

* cited by examiner

*Primary Examiner*—Thien F. Tran
(74) *Attorney, Agent, or Firm*—McDermott Will & Emery LLP

(57) ABSTRACT

A semiconductor device includes an alignment mark arranged on a surface, and including a high reflectance portion and a flat low reflectance portion; and a first silicon oxide film formed internally and provided with a plurality of first embedded portions filled with a material different from a material of portions around the embedded portions. The first embedded portions are formed in at least a portion of a region avoiding a portion shaded by projecting the high reflectance portion onto the silicon oxide film.

4 Claims, 12 Drawing Sheets

SEMICONDUCTOR DEVICE WITH ALIGNMENT MARK

BACKGROUND OF THE INVENTION

1. Field of the Invention

The present invention relates to a semiconductor device, and particularly to a semiconductor device provided at its main surface with an alignment mark.

2. Description of the Background Art

A manufacturing process of a semiconductor device includes steps, in which positioning is performed by recognizing an alignment mark. For example, a process of manufacturing a semiconductor device with memory cells includes a step, in which a position of a fuse is determined for switching circuits. Many semiconductor devices with memory cells are provided in advance with spare cells because a failure may occur in some of the memory cells due to foreign material mixed thereinto during a manufacturing step. When the failure in cells is found, the circuit is switched to replace faulty memory cells with the spare cells. For this replacement, such a manner has been widely employed that a corresponding fuse formed in the circuit is blown to designate a specific cell address. A laser trimming manner, in which a laser beam is emitted for blowing, has been widely employed for blowing the fuse. For determining the position of the fuse, the semiconductor device is provided with alignment marks. By using the same laser as that used for the blowing, the alignment mark formed on the semiconductor device is scanned, and the alignment mark is recognized by sensing contrast between light reflected from a high reflectance portion and light reflected from a low reflectance portion around the high reflectance portion in the alignment mark.

Japanese Patent Laying-Open No. 2001-168194 has disclosed a semiconductor device with alignment marks, in which a low light reflectance region is formed on the same thin film as a fuse element. This semiconductor device is provided at the low light reflectance region with many dots each formed of a thin film of polycrystalline silicon, which is the same thin film as the fuse element. In another structure, a first insulating film formed of a silicon oxide film is formed on a silicon substrate, and a polycrystalline silicon thin film is partially formed in a dot-like form on the first insulating film. Unevenness is formed at a surface of an aluminum film, which is located above a region provided with the dot-like polycrystalline silicon film. This unevenness irregularly reflects light beams emitted thereto. This region serves as a low light reflectance region. Further, a portion of the aluminum film, which is located on a region not provided with the polycrystalline silicon thin film, has a flat surface, and can serve as a high light reflectance portion. As described above, the foregoing reference has disclosed an alignment pattern formed of the low and high light reflectance regions.

Japanese Patent Laying-Open No. 7-335721 has disclosed a semiconductor device having alignment marks, which provide a large difference in intensity of reflected light. The alignment mark has a flat portion reflecting laser beams vertically upward, and an uneven portion for irregularly reflecting the laser beams. To a vertically upper portion, the flat portion of the alignment mark can reflect the light of a high intensity, but the uneven portion can reflect only the light of a low intensity. This is because surfaces of the uneven portion irregularly reflect substantially all laser beams. In this manner, a large difference occurs in intensity of the reflected light so that the alignment mark can be recognized accurately.

For reduction in size and increase in operation speed of semiconductor devices in recent years, various new materials have been newly used for production of the semiconductor devices. For example, copper is used as an interconnection material for lowering a resistance value of interconnections and thereby increasing the operation speed, and a silicon nitride film or the like is formed on an upper surface of such an interconnection layer for the purpose of preventing diffusion of the copper from the interconnection layer. A material of a lower dielectric constant than a conventional interlayer material is being used as a material between the interconnection layers. These new materials have been newly used for achieving an intended performance of the semiconductor devices. Therefore, optical characteristics-such as reflection characteristics and refraction characteristics of these materials are not necessarily optimum for scanning of the alignment marks with laser beams.

This causes a problem when a predetermined alignment mark is to be recognized with a light source, e.g., of laser in a manufacturing process of a semiconductor device. Thus, such a problem occurs that the mark cannot be recognized without difficulty because large noises coming from a portion around the intended mark are added to the light beams reflected by the mark. The alignment mark is basically formed of high and low reflectance portions. By scanning the mark with laser beams, a reflection waveform is obtained. This reflection waveform is formed of a portion of light of a large intensity primarily reflected by the high reflectance portion and a portion of light of a low intensity primarily, which is reflected by the low reflectance portion and a layer boundary immediately under the low reflectance portion. If all insulating films layered within the semiconductor device are made of silicon oxide films, a difference in refractive index between the layered films is very small. Therefore, laser beams incident on the low reflectance portion passes through the respective insulating films made of the silicon oxide films. The laser beams reflected from the low reflectance portion have a low intensity, and can provide good reflection waveforms, which allow easy discrimination between portions of high and low light intensities. However, if insulating films such as silicon nitride films or silicon carbide films are added to the insulating films of silicon oxide films as already described, a difference occur in refractive index between the insulating films. For example, if the silicon oxide film and silicon nitride film are layered together, the neighboring films represent different refractive indexes, respectively. Thereby, a boundary surface between the silicon oxide film and silicon nitride film partially reflects the incoming laser beams so that the laser beams returning from the low reflectance portion have a relatively high intensity. In particular, if the semiconductor device is internally provided with many interconnection layers, laser beams are reflected by the surfaces of the interconnection layers to a large extent. This reduces a difference in intensity between the light reflected from the high reflectance portion and the light reflected from the low reflectance portion so that the position of the alignment mark cannot be accurately determined.

Meanwhile, semiconductor devices employing more layers have been developed and employed and, in the field of system LSIs (Large Scale Integrated Circuits), semiconductor devices internally provided with six or more interconnection layers have been increasing. With increase in number of the layers, variations in total thickness of the multilayer structure may increase due to summing of variations in film thicknesses of the respective layers. Depending on these variations, variations occur in intensity of light reflected from the low reflectance portion, resulting in unstable recognition of the alignment mark. In particular, required accuracy of positioning in a fuse blowing step has been increasing in accordance with miniaturization of semiconductor devices, but difficulty in maintaining intended accuracy of recognizing the alignment mark has been increasing due to formation of the insulating films of various materials, and thus due to variations in component material,

SUMMARY OF THE INVENTION

An object of the invention is to provide a semiconductor device, which allows stable recognition of an alignment mark independently of a structure of the semiconductor device.

For achieving the above object, a semiconductor device of a first aspect of the invention includes an alignment mark arranged on a surface of the semiconductor device, and including a high reflectance portion and a flat low reflectance portion; and a refraction film formed internally and provided with a plurality of embedded portions filled with a material different from a material of portions around the embedded portions. The embedded portions are formed in at least a portion of a region avoiding a portion shaded by projecting the high reflectance portion onto the refraction film.

According to a second aspect of the invention, a semiconductor device includes an alignment mark arranged on a surface of the semiconductor device, and including a high reflectance portion and a flat low reflectance portion; and an irregular reflection film arranged internally, and having unevenness. The unevenness is formed in at least a portion of a region avoiding a portion shaded by projecting the high reflectance portion onto the irregular reflection film.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS (First Embodiment)

Referring to FIGS. 1 to 6, description will now be given on a semiconductor device according to a first embodiment of the invention.

Figure 1A:
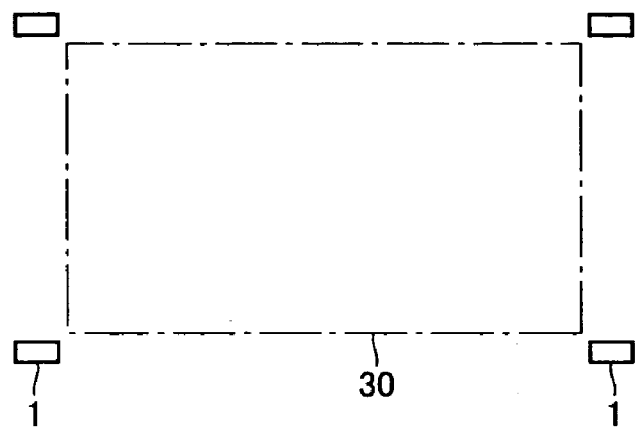
FIGS. 1A and 1B illustrate alignment marks.
Figure 1B:
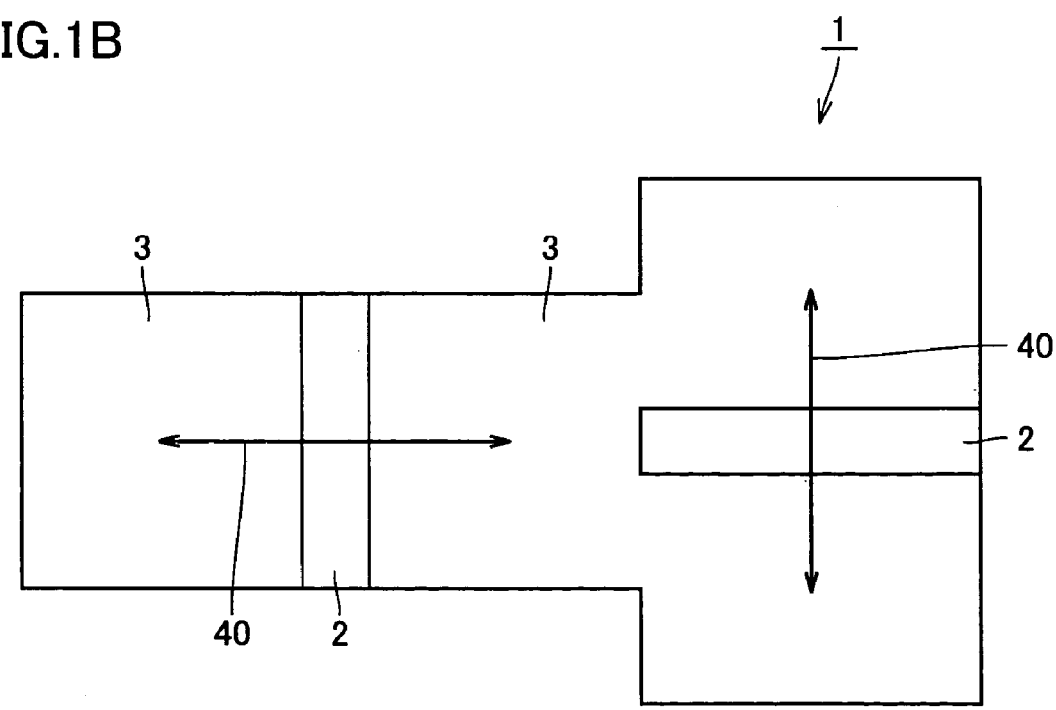

FIG. 1A is a schematic plan illustrating positions where alignment marks are formed. FIG. 1B is a plan of the alignment mark. As illustrated in FIG. 1A, alignment marks 1 are formed around a fuse arrangement region 30 provided with memory cells and others. In this embodiment, alignment marks 1 are formed in four positions around fuse arrangement region 30, respectively. As illustrated in FIG. 1B, alignment mark 1 includes high reflectance portions 2 and low reflectance portions 3 surrounding or neighboring to high reflectance portions 2. Low reflectance portion 3 is formed of a part of a silicon nitride film formed on a surface of the semiconductor device. High reflectance portion 2 has a plate-like form, and is formed above low reflectance portions 3. Low reflectance portion 3 forms a part of a main surface of the semiconductor device, and has a flat form without unevenness. High reflectance portions 2 are formed in two positions, respectively, and longitudinal directions thereof are perpendicular to each other. If laser beams for scanning the alignment mark have a wavelength in a near-infrared region, high reflectance portion 2 is formed of a metal interconnection layer, e.g., of aluminum or copper. The wavelength of laser beams in the near-infrared region is substantially in a range, e.g., from 1.0 µm to 1.35 µm.

Figure 2:
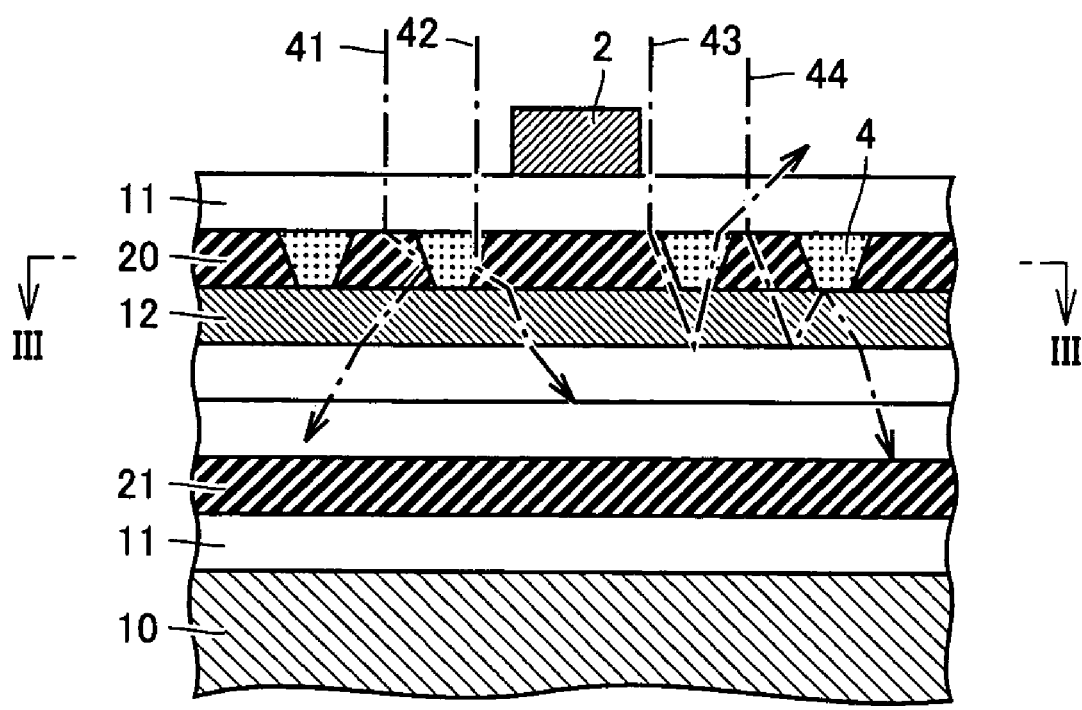
FIG. 2 is a cross section of a first semiconductor device according to a first embodiment of the invention.
Figure 3:
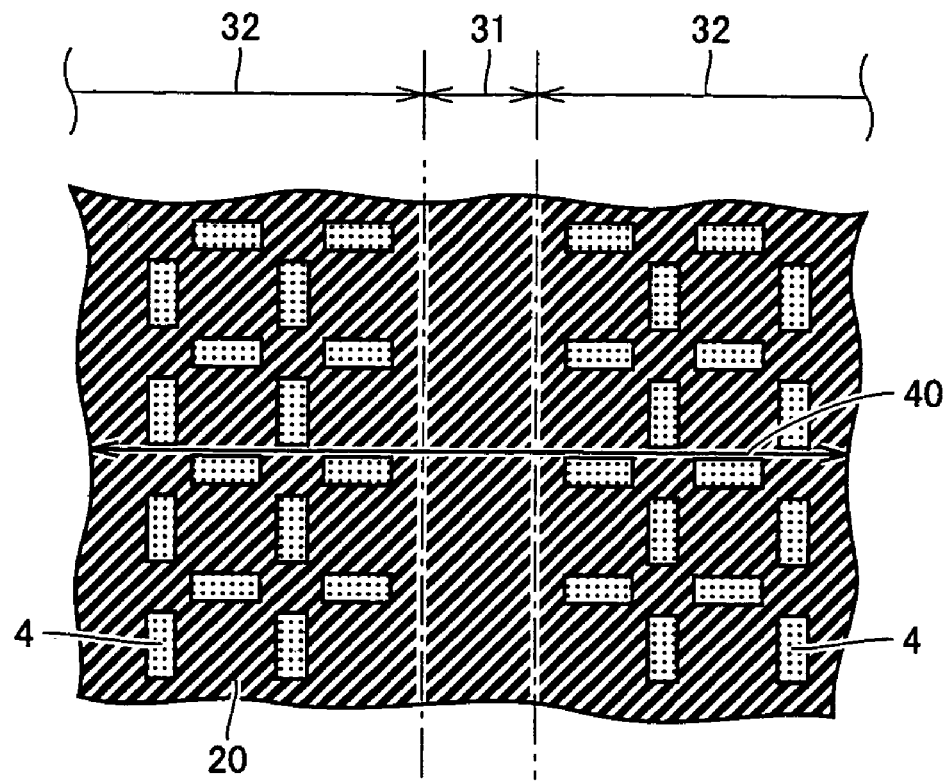
FIG. 3 is a cross section taken along line III—III in FIG. 2.

FIGS. 2 and 3 show a first semiconductor device of the embodiment. FIG. 2 is a schematic cross section of a portion provided with the alignment mark in the first semiconductor device. The semiconductor device of this embodiment includes a silicon nitride film 11, a silicon carbide film 12, a first silicon oxide film 20 and a second silicon oxide film 21, which are formed as insulating layers on a main surface of a semiconductor substrate 10. First silicon oxide film 20 serves as a refraction layer, and is provided with a plurality of first embedded portions 4. First embedded portion 4 penetrates first silicon oxide film 20. In a sectional structure shown in FIG. 2, first embedded portion 4 has a trapezoidal form. High reflectance portion 2 is formed on the main surface of the semiconductor device. The low reflectance portion of the alignment mark is formed of a flat main surface of silicon nitride film 11. On the main surface of silicon nitride film 11, regions surrounding and neighboring high reflectance portion 2 define the low reflectance portion.

First silicon oxide film 20 is formed as the refraction layer for primarily refracting laser beams. High reflectance portion 2 is formed on an upper surface of the semiconductor device. First embedded portions 4 are formed in a region immediately under a whole region of the alignment mark, and more specifically are located in a region avoiding a portion, which is shaded by projecting high reflectance portion 2 onto first silicon oxide film 20. In this embodiment, first embedded portions 4 are formed in positions surrounding the portion shaded by high reflectance portion 2. First embedded portions 4 are spaced from each other.

FIG. 3 is a cross section taken along line III—III in FIG. 2. A belt-like region, which is located substantially in a center of the cross section of FIG. 3, is a projected region 31 shaded by projecting high reflectance portion 2 onto first silicon oxide film 20. Projected regions 32, which are shaded by projecting the low reflectance portions onto first silicon oxide film 20, are located on the both sides of projected region 31. Each first embedded portion 4 has a rectangular form in a plan view First embedded portions 4 are formed regularly at first silicon oxide film 20. Longitudinal directions of first embedded portions 4 are parallel or perpendicular to the longitudinal direction of projected region 31. First embedded portions 4 are arranged on four sides of each of nearly regular squares defined by an imaginary grid, respectively.

First embedded portion 4 is filled with a material different from that around first embedded portion 4. In this embodiment, first embedded portion 4 is filled with a material different from first silicon oxide film 20. Besides the material primarily made of semiconductor, metal of a high reflectance such as copper or aluminum can be used for filling.

In this embodiment, first embedded portion 4 is formed in the first silicon oxide film serving as the refraction layer. However, first embedded portion 4 may be formed in another insulating film, i.e., silicon nitride film 11 or silicon carbide film 12. Although first embedded portion 4 has a rectangular form in a plan view, this is not restrictive, and the first embedded portion may be circular in a plan view. In the cross section of FIG. 2, first embedded portion 4 has a trapezoidal sectional form. However, this is not restrictive, and first embedded portion 4 may have a rectangular sectional form. Thus, a boundary between first silicon oxide film 20 and first embedded portion 4 may be parallel to an incident direction of the laser beams. First embedded portion 4 may be formed in the portion shaded by projecting high reflectance portion 2 onto first silicon oxide film 20. As shown in FIG. 3, first embedded portions 4 may not be formed regularly, and may be formed in irregular positions, respectively.

Figure 4:
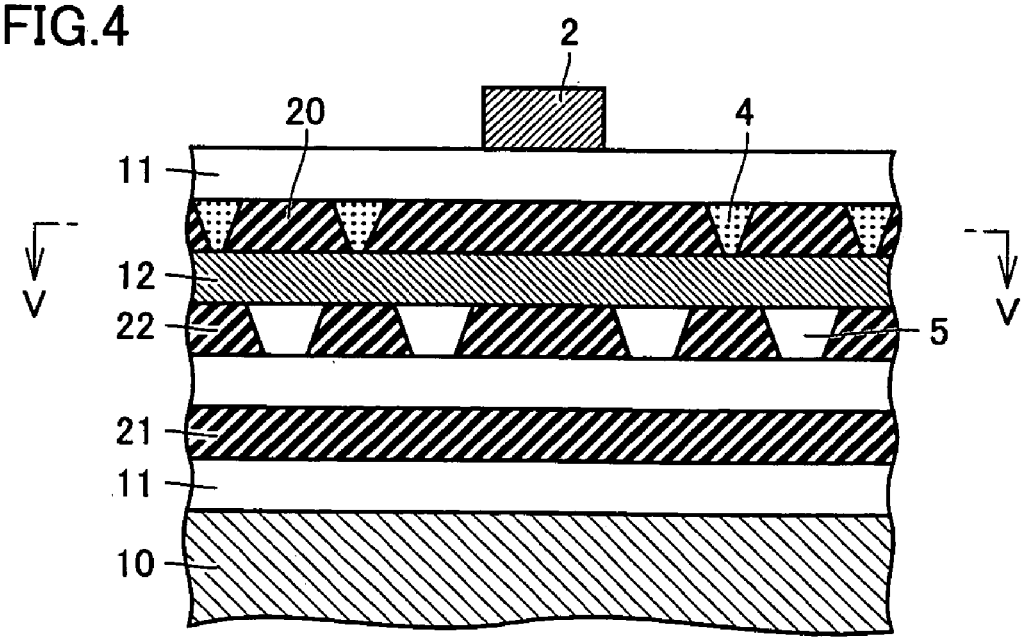
FIG. 4 is a cross section of a second semiconductor device according to the first embodiment of the invention.
Figure 5:
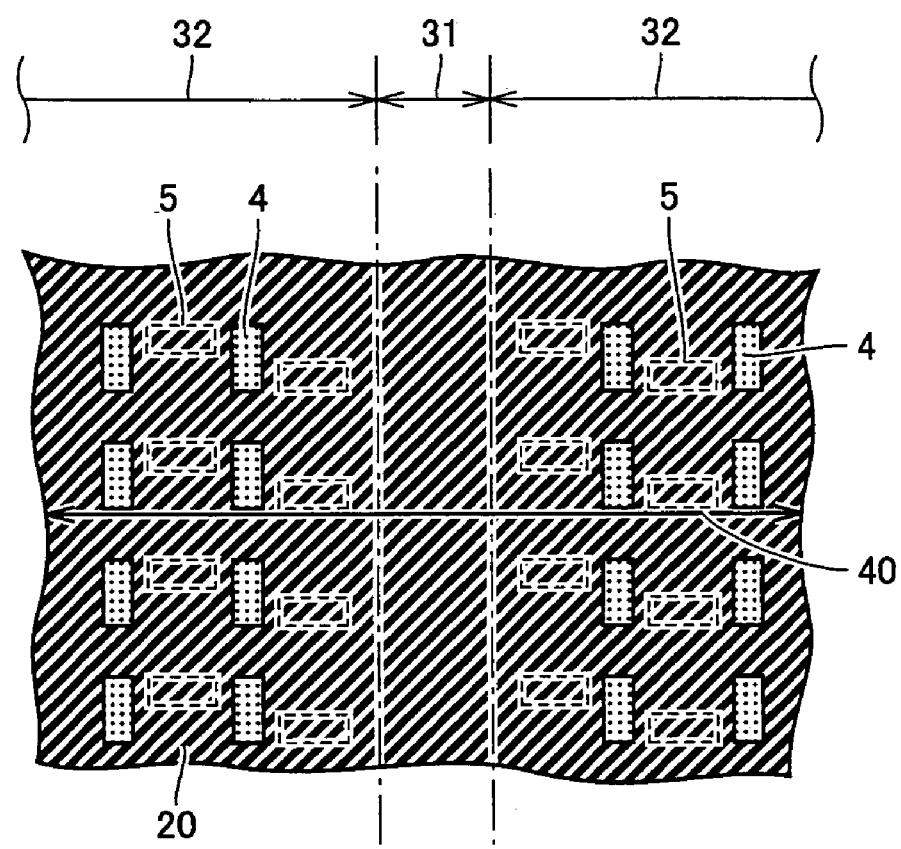
FIG. 5 is a cross section taken along line V—V in FIG. 4.

FIGS. 4 and 5 show a second semiconductor device of the embodiment. FIG. 4 is a cross section schematically showing a portion of an alignment mark in the second semiconductor device. This semiconductor device includes a third silicon oxide film 22 in addition to first and second silicon oxide films 20 and 21. Third silicon oxide film 22 is internally provided with second embedded portions 5. First and third oxide films 20 and 22 serve as the refraction layers, respectively. Thus, the second semiconductor layer includes the two refraction layers. Both the refraction layers are formed inside the semiconductor device, and the semiconductor device has a flat surface.

FIG. 5 is a cross section taken along line V—V in FIG. 4. First silicon oxide film 20 is internally provided with first embedded portions 4 each having a rectangular form. A longitudinal direction of each first embedded portion 4 is parallel to a longitudinal direction of projected region 31 of the high reflectance portion. First embedded portions 4 are arranged in a plurality of parallel rows, and first embedded portions 4 in each row are aligned to each other with a uniform space therebetween. Second embedded portions 5 are formed in third silicon oxide film 22, and each have a rectangular form similarly to first embedded portions 4. A longitudinal direction of each second embedded portion 5 is perpendicular to the longitudinal direction of first embedded portion 4. Second embedded portions 5 are arranged in a plurality of parallel rows, and second embedded portions 5 in each row are aligned to each other with a uniform space therebetween. The rows of first embedded portions 4 and the rows of second embedded portions 5 are located alternately to each other. As described above, the first and second embedded portions 4 and 5 are arranged regularly.

Second embedded portions 5 are arranged not to overlap with first embedded portions 4 when viewed from the side of high reflectance portion 2 through the films and layers. First and second embedded portions 4 and 5 are formed such that each of first and second embedded portions 4 and 5 may avoid projected region 31, which is shaded by projecting the high reflectance portion onto the corresponding layer. Structures other than the above are substantially the same as those of the first semiconductor device already described, and description thereof is not repeated.

Recognition of the alignment marks is performed with laser beams applied to the respective alignment marks. As illustrated in FIG. 1B, scanning with the laser beams is performed in laser scanning direction 40 perpendicular to the longitudinal direction of high reflectance portion 2. The scanning with laser beams is effected on high reflectance portions 2 and the surrounding or neighboring portions (low reflectance portions 3). For the alignment mark illustrated in FIG. 1B, the scanning with laser beams is effected on two high reflectance portions 2.

Figure 6:
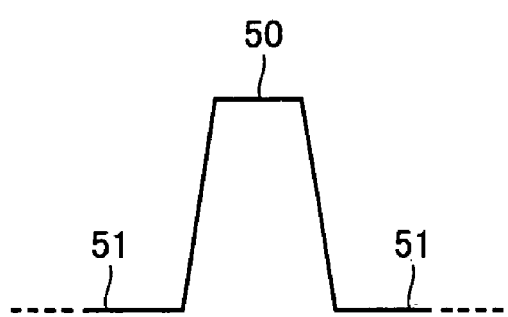
FIG. 6 illustrates a concept of a reflection waveform obtained by scanning with laser beams.

FIG. 6 illustrates a reflection waveform obtained by receiving reflected laser beams. The reflection waveform includes a peak portion 50 and bottom portions 51. The light primarily reflected from the high reflectance portion forms peak portion 50 exhibiting a relatively high intensity of light. The light primarily reflected from the low reflectance portion forms bottom portions 51 exhibiting a relatively low intensity of light on the both sides of peak portion 50, respectively. From the alignment mark shown in FIG. 1B, the above reflection waveform can be obtained by scanning each of two high reflectance portions 2 with laser beams. By determining the position of peak portion 50 of this reflection waveform, it is possible to determine the position of the alignment mark. According to the reflection waveform, contrast increases with increase in difference between the reflected light intensity of peak portion 50 and that of both bottom portions 51, and thereby the position of the alignment mark can be determined more accurately.

The laser beams emitted toward the alignment mark is reflected and refracted (or passed) at the boundary between mediums of materials having different refractive indexes, respectively. In FIG. 2, arrows 41, 42, 43 and 44 represent, by way of example, paths of the incoming laser beams. A part of the laser beams entering first silicon oxide film 20 collide with and reflected by a boundary between first embedded portion 4 and first silicon oxide film 20. As indicated by arrow 42, some laser beams enter first embedded portion 4, and are refracted by the boundary between first embedded portion 4 and first silicon oxide film 20 to change the direction. The laser beams reflected by other layer boundaries are refracted by the boundary of first embedded portion 4 to change the direction as indicated by arrow 43, or are reflected by the boundary of first embedded portion 4 to change the directions as indicated by arrow 44.

As described above, the first silicon oxide film serving as the refraction layer refracts or reflects the laser beams emitted toward the alignment mark, and thereby can achieve the substantially same effect as that achieved by scattering the laser beams in various directions. In particular, it can achieve the effect of scattering the laser beams passing through the low reflectance portion toward the inner side. Therefore, such a situation can be suppressed that the boundary surface of each layer reflects the laser beams incident on the low reflectance portion, and thereby returns the beams oppositely to the incident direction. Therefore, the light intensity at the bottom portion of the reflection waveform can be low. Meanwhile, nearly all the laser beams incident on the high reflectance portion are reflected oppositely to the incident direction by the surface of the high reflectance portion, and thus are recognized as the peak portion of the reflection waveform. As a result, a large difference occurs in light intensity between the peak portion and bottom portion of the reflection waveform thus-formed so that the recognition accuracy of the alignment mark can be improved.

In a semiconductor device according to the prior art, the intensities of peak and bottom portions of the reflection waveform may not be constant because a significant influence is exerted by variations in thickness of the insulating films due to wave motion properties of the light. In the semiconductor device according to the invention, the refraction layer can change the direction of the laser beams emitted into the semiconductor device to various directions. Therefore, the reflection waveform having the bottom portion of the uniform intensity can be obtained without being affected by the variations in thickness of the insulating films. The semiconductor device according to the invention can suppress the influence by variations in thickness of the plurality of insulating films, and can exhibit the reflection waveform of the laser beams exhibiting high contrast.

According to the semiconductor device of the invention, the refraction layer is not required to be located at the same layer as that provided with the fuse, and can be located at an arbitrary insulating film in the semiconductor device. The embedded portion is merely required to be formed around the region, which is located within the semiconductor device and immediately under the high reflectance portion (i.e., the region shaded by projecting the high reflectance portion). The embedded portion may be located in a region immediately under the high reflectance portion. Therefore, it is not necessary to adjust strictly the positions of the high reflectance portion and the embedded portions, and the high reflectance portion can be formed with a high degree of freedom so that designing can be easy, and the alignment marks can be formed easily and precisely.

A multi-layer interconnection process, which is employed at present, includes a step of flattening interlayer films of various interconnections by CMP (Chemical Mechanical Polishing) after forming the interconnection layers and interlayer films. Boundaries between the layers have flat forms without unevenness. Therefore, the manufacturing method utilizing the CMP method cannot form unevenness at an interconnection layer, and thus cannot form unevenness, which follow the unevenness at the interconnection layer, at a surface of an alignment mark, in contrast to a conventional art disclosed, e.g., by Japanese Patent Laying-Open No. 7-335721. However, the manufacturing method according to the invention can be applied even to the manufacturing method utilizing the CMP method.

Since first embedded portion 4 extends penetrating first silicon oxide film 20, first embedded portion 4 has side surfaces of a large area, and thus can reflect and refract the beams by the side surfaces to a larger extent. As shown in FIG. 3, first embedded portions. 4 are formed regularly, and therefore can uniformize the effect of scattering laser beams by the refraction layer. Consequently, the peak portion and bottom portion of the reflection waveform can be flat so that the reflection waveform exhibits higher contrast.

A second semiconductor device according to the invention is internally provided with two refraction layers. The semiconductor device according to the invention can employ the plurality of refraction layers scattering laser beams. Provision of the plurality of refraction layers can increase the effect of scattering the laser beams inside the semiconductor device, and can reduce the intensity of laser beams at the bottom portion of the reflection waveform. Accordingly, it is possible to produce the reflection waveform exhibiting higher contrast.

As described above, the alignment marks are formed around the region provided with the fuse so that the alignment marks can be recognized accurately, and the position of the fuse can be determined accurately. In particular, since the blowing of fuses is performed in accordance with results of final inspection effected on the device in a wafer form, it is necessary to determine the position under such conditions that all manufacturing variations or the like in and before the fuse blowing step are taken into consideration. Therefore, stable alignment is difficult as compared with other steps. By applying the invention to the step of blowing the fuse, it is possible to determine accurately the alignment mark, and the effect of the invention can be remarkable. The semiconductor device of the invention can be used for another mark by changing the size, pattern or the like of the alignment mark according to the purpose and device. For example, the invention can be applied to marks for using a stepping projection aligner.

(Second Embodiment)

Referring to FIGS. 7 to 22, description will now be given on a semiconductor device of a second embodiment according to the invention.

Figure 7:
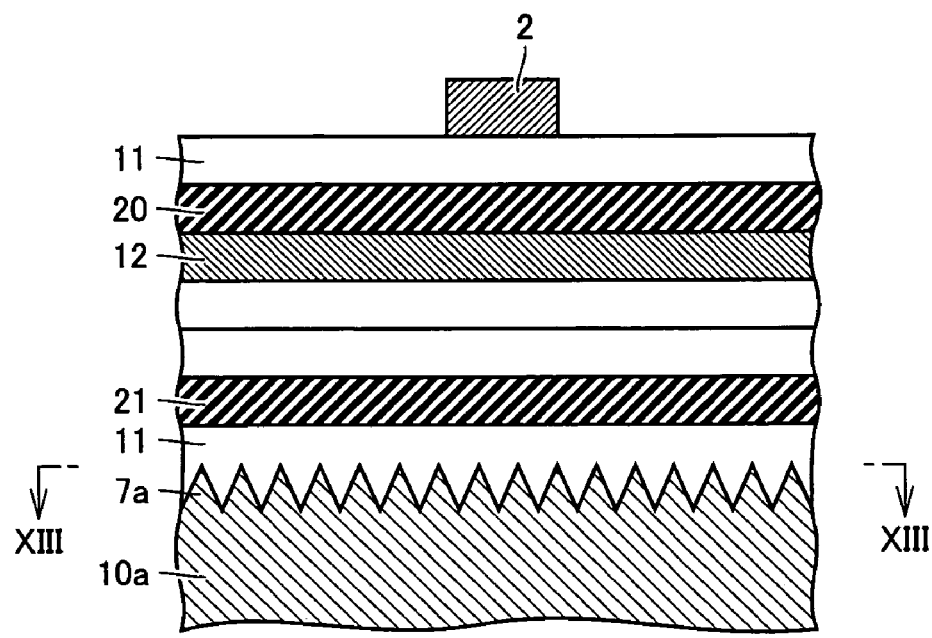
FIG. 7 is a cross section of a semiconductor device according to a second embodiment of the invention.

FIG. 7 is a schematic cross section of a portion of an alignment mark in the semiconductor device of the second embodiment. Silicon nitride film 11, silicon carbide film 12 and silicon oxide films 20 and 21 are formed on the upper surface of the silicon substrate, and high reflectance portion 2 is formed on the main surface. These structures are substantially the same as those of the first semiconductor device of the first embodiment. Silicon nitride film 11 providing the low reflectance portion has the flat upper surface. This is also the same as that in the first semiconductor device of the first embodiment.

In the semiconductor device according to the embodiment, a silicon substrate 10*a* has convex portions 7*a* at its upper portion. Silicon substrate 10*a* provides an irregular reflection film primarily performing irregular reflection. Convex portions 7*a* have upwardly converging sections, respectively, and convex portions 7*a* each having a uniform form are repetitively and densely arranged. Convex portions 7*a* are formed immediately under the whole region providing the alignment mark, and each projects oppositely to the incident direction of laser beams. High reflectance portion 2 is located at the main surface of the semiconductor device, and has a flat form similarly to that in the first semiconductor device of the first embodiment.

Figure 8:
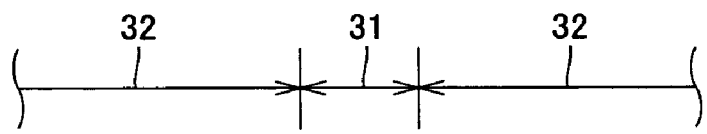
FIG. 8 is a cross section taken along line XIII—XIII in FIG. 7.
Figure 8:
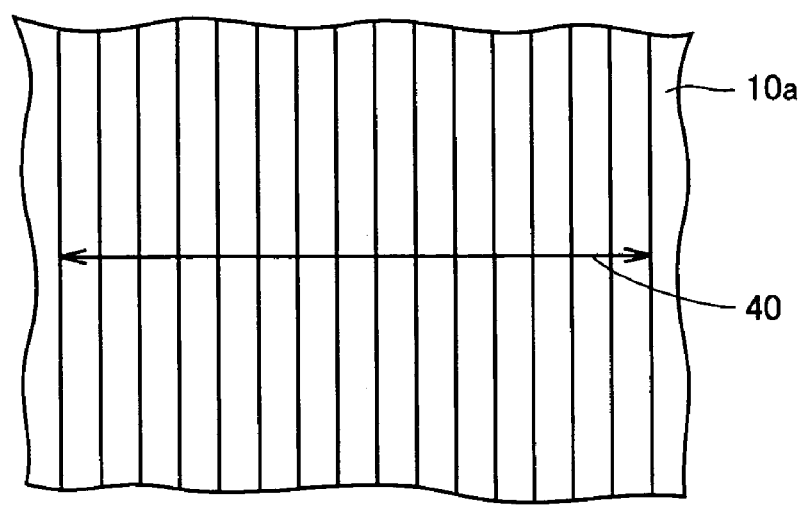

FIG. 8 is a cross section taken along line XIII—XIII in FIG. 7. An arrow indicates a laser scanning direction 40, in which scanning with laser beams is performed. Projected region 31 of the high reflectance portion is defined by the shadow formed by projecting high reflectance portion 2 onto silicon substrate 10*a*. Projected regions 32 of the low reflectance portions are located around or near projected region 31 of the high reflectance portion, and are defined by shadows formed by projecting the low reflectance portions onto silicon substrate 10a.

Figure 9A:
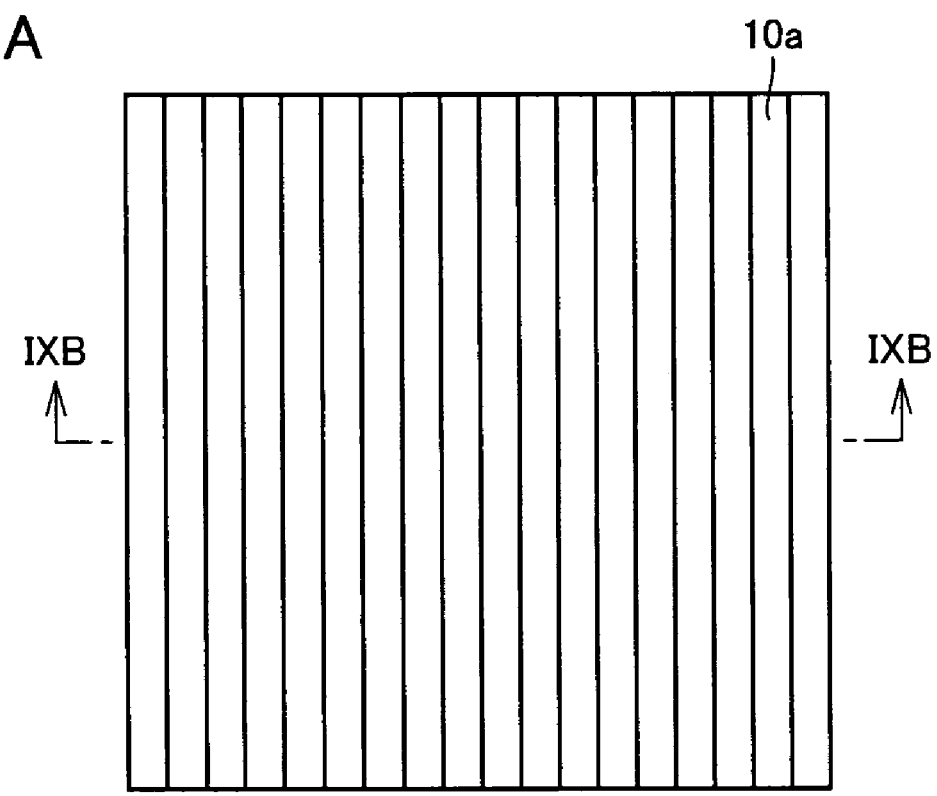
FIGS. 9A and 9B illustrate a first silicon substrate according to the second embodiment of the invention.
Figure 9B:
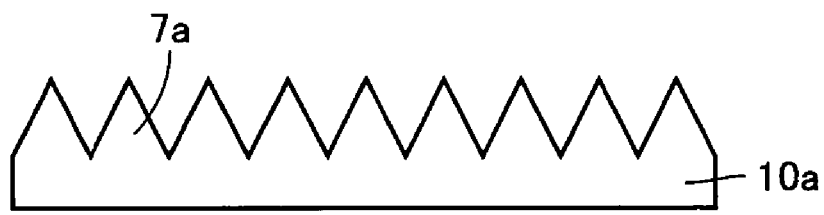

FIGS. 9A and 9B illustrate first silicon substrate 10a serving as the irregular reflection film. FIG. 9A is a plan of silicon substrate 10a, and FIG. 9B is a cross section taken along line IXB—IXB in FIG. 9A. Convex portions 7a according to the embodiment are substantially defined by triangle poles, which neighbor to each other and are arranged on the upper surface of the flat substrate. Each convex portion 7a has a nearly triangular section as shown in FIG. 9B, and has a top edge parallel to those of other convex portions 7a as shown in the plan of FIG. 9A.

Figure 10A:
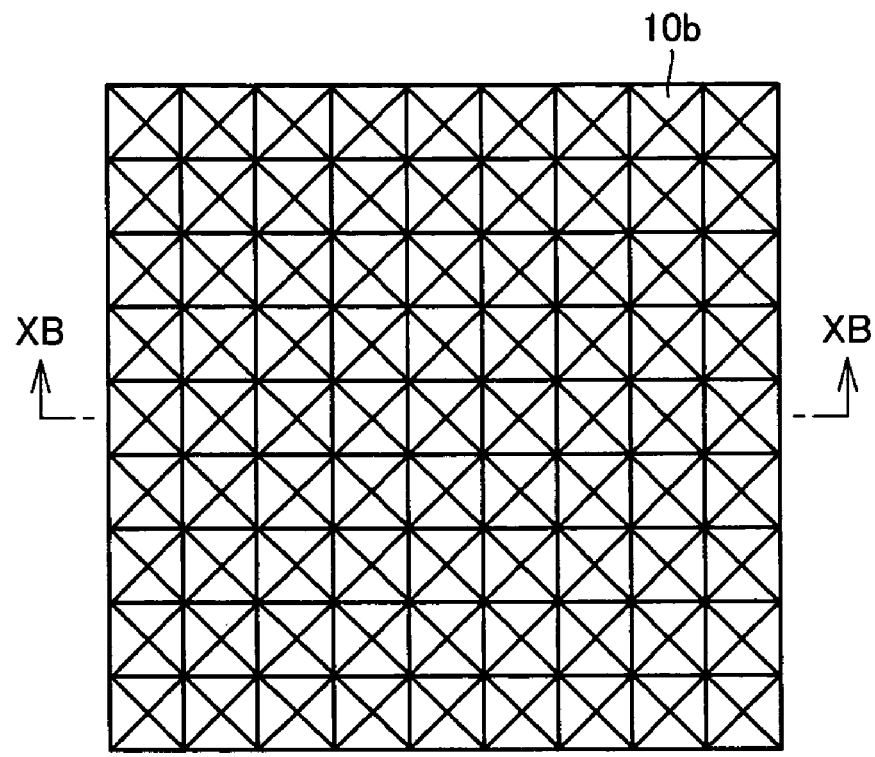
FIGS. 10A and 10B illustrate a second silicon substrate according to the second embodiment of the invention.
Figure 10B:
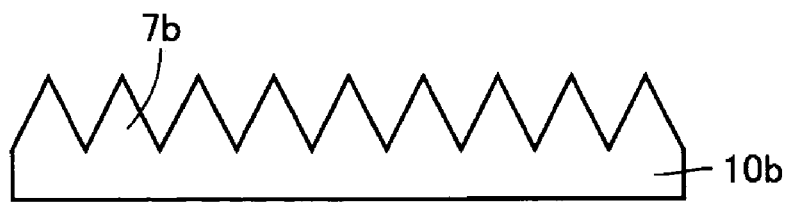

FIGS. 10A and 10B show silicon substrate 10b serving as a second irregular reflection film according to the embodiment. FIG. 10A is a plan of silicon substrate 10b. FIG. 10B is a cross section taken along line XB—XB in FIG. 10A. Convex portions 7b each having a rectangular pyramidal form are formed at an upper portion of silicon substrate 10b. Convex portions 7b are arranged densely and regularly in contact with each other. As shown in FIG. 10A, convex portion 7b has a square bottom. As described above, the unevenness arranged at the irregular reflection film may be formed of convex portions, which have three-dimensional shapes, respectively, and are arranged densely in a matrix form. Each convex portion may have a form other than the rectangular pyramid, and may have, e.g., a conical form. It is preferable that each convex portion has a sharp apex, but may have an apex of another form. Each convex portion may have a form, which cannot be clearly specified or defined without difficulty, and the convex portions may have an indefinite form.

In this embodiment, the unevenness is formed at the silicon substrate serving as the irregular reflection film. However, this is not restrictive, and the unevenness may be formed in any one of the inner insulating layers serving as the irregular reflection film. Further, two or more irregular reflection films may be formed.

Structures other than the above are substantially the same as those of the first semiconductor device of the first embodiment, and description thereof is not repeated.

In FIG. 8, the scanning with laser beams is performed in laser scanning direction 40. The laser beams incident on the low reflectance portion are reflected or refracted (and passed) at the respective boundaries of the layers during its further traveling. The beams incident on high reflectance portion 2 are nearly entirely reflected oppositely to the incident direction.

Figure 11:
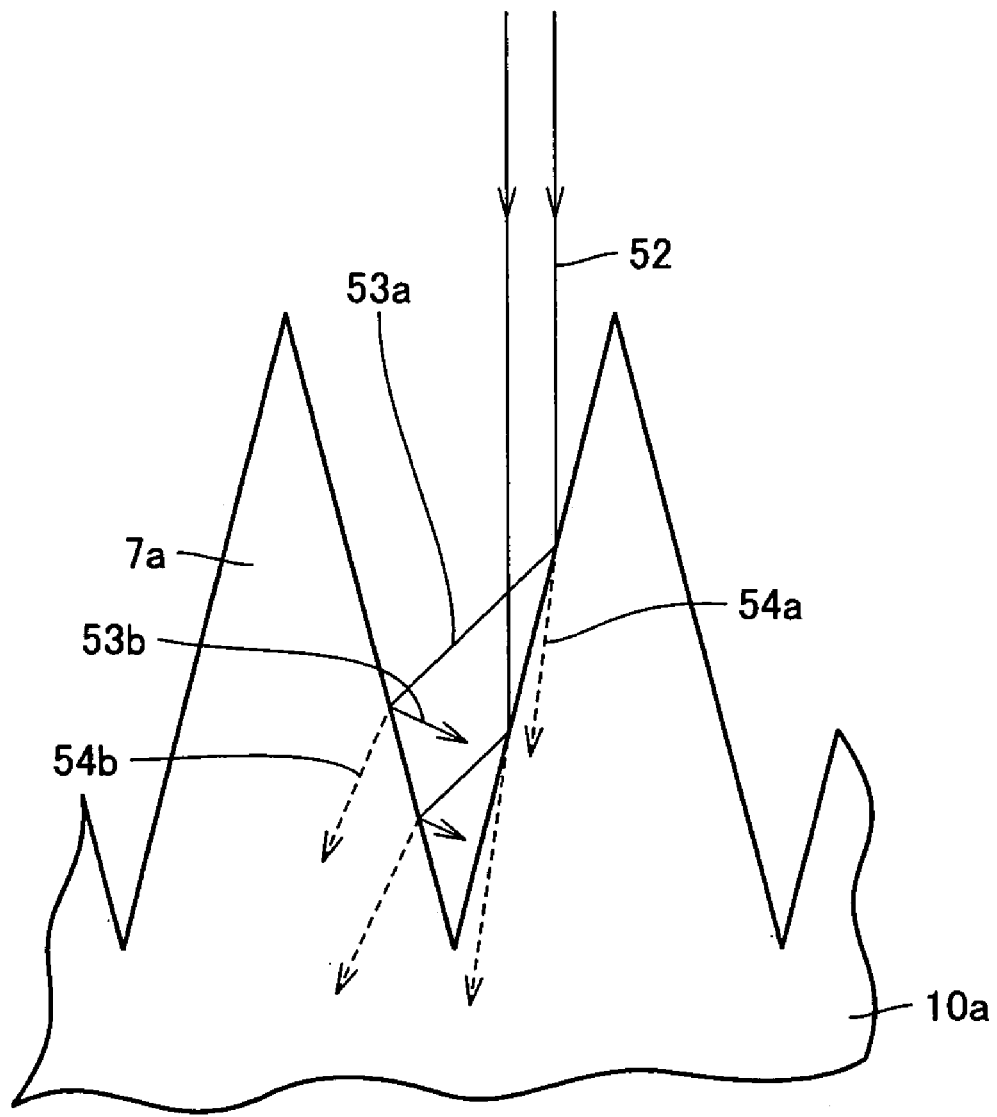
FIG. 11 is a cross section showing, on an enlarged scale, convex portions of an irregular reflection film according to the second embodiment of the invention.

FIG. 11 illustrates laser beams incident on silicon substrate 10a serving as the irregular reflection film. FIG. 1, is a cross section showing, on an enlarged scale, convex portions 7a. Incident laser beams 52 collide with the surface of convex portion 7a, and are divided into reflected beams 53a and refracted beams 54a (or passed beams). Reflected beams 53a collide with neighboring convex portion 7a again, and are divided into reflected beams 53b and refracted beams 54b (or passed beams). When the laser beams arrive at the irregular reflection film, neighboring convex portions 7a repetitively reflect and refract (and pass) the laser beams. Refracted beams 54a and 54b collide with convex portions 7a at different vertical positions or heights before refraction or reflection. By refracting or reflecting the laser beams at various heights, the beams can be scattered more effectively. Further, refracted light 54a and 54b are partially absorbed by the irregular reflection film.

The reflection, refraction (or passing) and absorbing thus performed can suppress returning of the laser beams toward the alignment mark. Therefore, it is possible to reduce the intensity of light at the bottom portion of the reflection waveform. Further, the laser beams incident on the high reflectance portion are nearly entirely reflected by the surface of the high reflectance portion so that the peak portion is formed in the reflection waveform. As described above, it is possible to reduce the intensity of light at the bottom portion of the reflection waveform, and thereby the contrast of the reflection waveform can be increased. Further, the peak portions exhibit the uniform light intensity, and the bottom portions likewise exhibit the uniform light intensity so that the waveform exhibiting clear contrast can be achieved.

Description will now be given on a function of the irregular reflection film. If a pitch of the convex portions formed at the irregular reflection film is longer than the wavelength of the incident laser beam, no diffraction beam is produced from the incident laser beams. Thus, the laser beam straightly enters the convex portion. Therefore, the portion of the irregular reflection film provided with the convex portions can be equivalently deemed as a medium having an average refractive index with respect to the incident laser beam.

Figure 12:
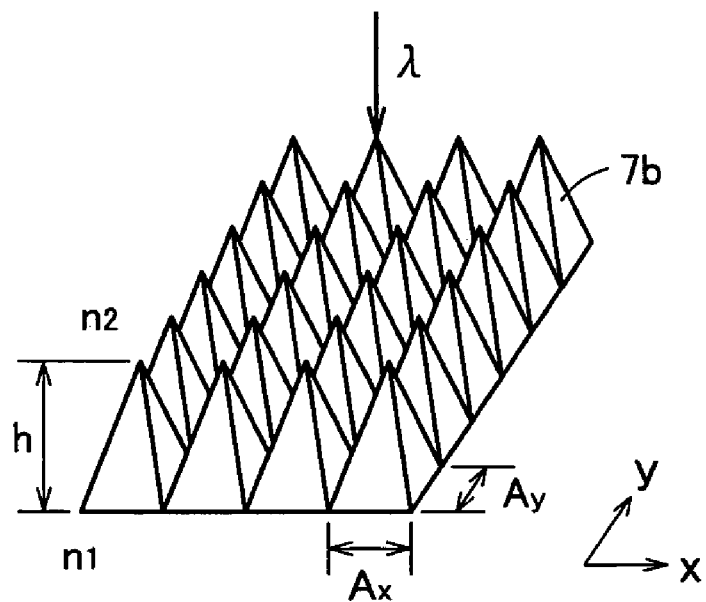
FIG. 12 is a perspective view of convex portions according to the second embodiment of the invention.

For example, it is assumed that the irregular reflection film has convex portions 7b each having a rectangular pyramidal form as shown in FIG. 12. The laser beam having a wavelength of $\lambda$ is emitted vertically downward. The convex portions are arranged with a pitch of Ax in the x direction and a pitch of Ay in the y direction. Each convex portion has a height of h. An inner refractive index of convex portion 7b is equal to n1, and a peripheral refractive index of convex portion 7b is equal to n2.

Figure 13A:
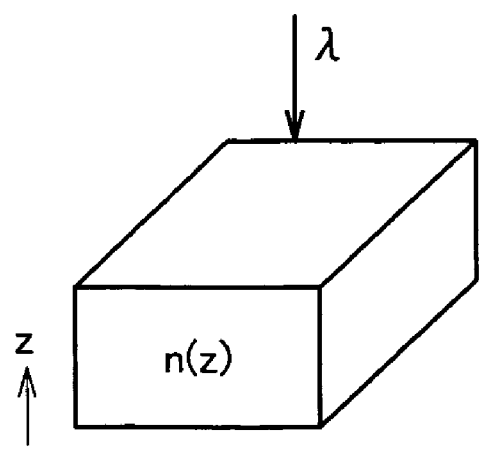
FIGS. 13A and 13B illustrate the irregular reflection film according to the second embodiment of the invention.
Figure 13B:
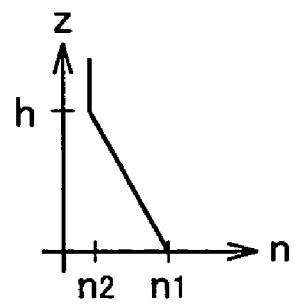

FIG. 13A is a perspective view of a medium having the refractive index of n(z). FIG. 13B is a graph representing a relationship between a height z and refractive index n(z). As illustrated in FIGS. 13A and 13B, convex portion 7b is equivalent to a medium, of which refractive index n is a function n(z) of z in a height direction. Thus, as shown in FIG. 13A, the structure in FIG. 12 can be equivalently deemed as the structure, in which laser beams having a wavelength of $\lambda$ is emitted vertically downward to a medium having a variable refractive index depending on z in the height direction. FIG. 13B is a graph representing a change in average refractive index in the z direction: In this graph, the abscissa gives the refractive index, and the ordinate gives the height. The refractive index at the apex of this medium is equal to n2, and thus is equal to refractive index of a material surrounding the convex portion. The refractive index gradually increases as the position moves toward the bottom of the medium. The refractive index at the bottom of the medium is equal to n1, and thus is equal to the internal refractive index of the convex portion. It can be considered that the portion of convex portion 7b is equivalent to the medium, of which refractive index continuously and gradually changes. The above average refractive index is an average value of the refractive index in the position of z with respect to the incident laser beam.

As shown in FIG. 13B, the incident laser beams are scattered in various directions in accordance with the gradual change in average refractive index. In general, the light is reflected to a larger extent at a position, where the refractive index rapidly changes. However, the refractive index continuously and gradually changes so that the laser beams are hardly reflected vertically upward so that the intensity of light reflected toward the alignment mark can be reduced. As the refractive index changes more slowly, reflection of the laser beams by the irregular reflection film is suppressed more effectively. In view of this, it is preferable that the aspect ratio (h/Ax or h/Ay) of convex portion 7b is two or more.

Each convex portion of the irregular reflection film may be uniformly spaced from the neighboring convex portions, but the convex portions in this embodiment are arranged repetitively and densely at the irregular reflection film. This structure of the embodiment can increase the effect of scattering the laser beams. Since the convex portions having uniform forms are formed repetitively, these can scatter the laser beams substantially uniformly in many directions.

Although the embodiment is provided with only one irregular reflection film, but it is more preferable to employ two or more irregular reflection films. By employing more irregular reflection films, the respective irregular reflection films can scatter the laser beams, and the irregular reflection film can scatter the laser beams passed through another irregular reflection film. This further increases the effect of scattering the laser beams.

The operation and effect other than the above are substantially the same as those of the semiconductor device according to the first embodiment, and therefore description thereof is not repeated.

Figure 14:
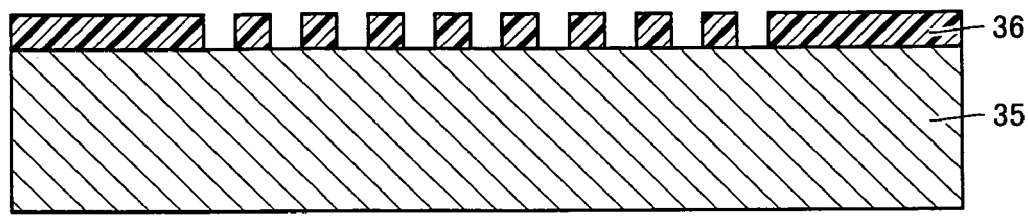
FIGS. 14–16 show steps in a first manufacturing method according to the second embodiment of the invention, respectively.
Figure 15:
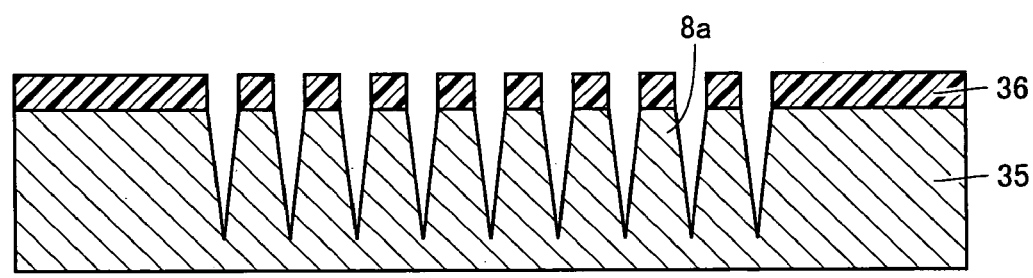
Figure 16:
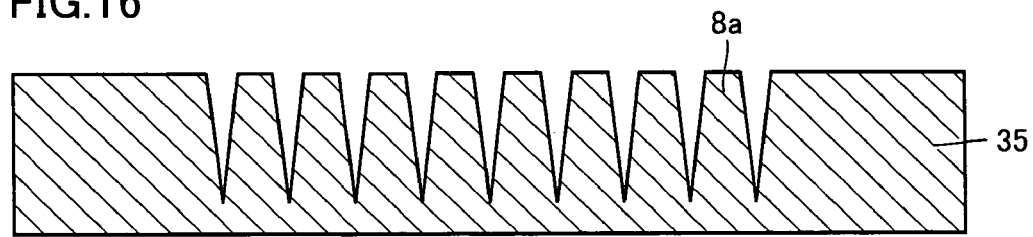

Referring to FIGS. 14 to 16, description will now be given on a first method of manufacturing the irregular reflection film according to this embodiment. The irregular reflection film in the following description has truncated convex portions. As shown in FIG. 14, a resist pattern 36 is formed on a main surface of a semiconductor substrate 35 such as a silicon substrate. As shown in FIG. 15, anisotropic etching is then effected on exposed portions of semiconductor substrate 35 masked with resist pattern 36. The anisotropic etching forms recesses each diverging upward. Then, resist pattern 36 is removed as shown in FIG. 16 so that convex portions 8a can be formed at the upper surface of the semiconductor substrate. Insulating films including the silicon oxide film, silicon nitride film and/or the like are formed on the upper surface of semiconductor substrate 35, and a metal interconnection layer serving as the high reflectance portion of the alignment mark is formed on the surface of the semiconductor device. In this manner, the irregular reflection film provided with the convex portions can be formed at the silicon substrate.

Figure 17:
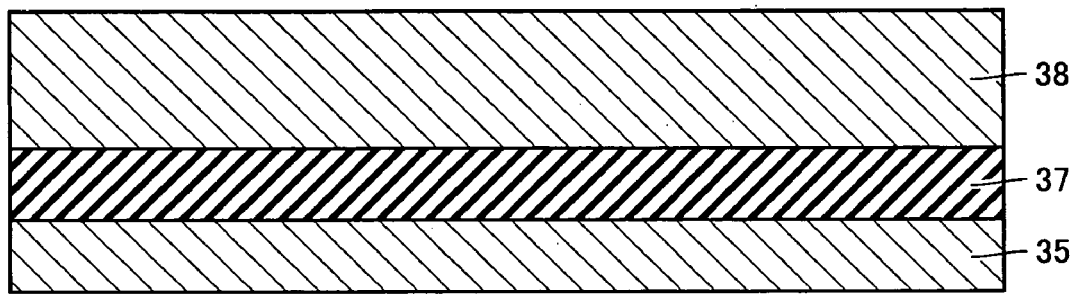
FIGS. 17–20 show steps in a second manufacturing method according to the second embodiment of the invention, respectively.
Figure 18:
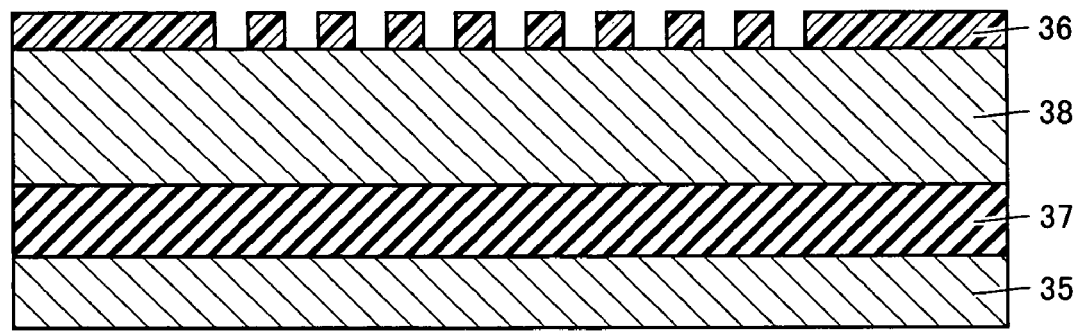
Figure 19:
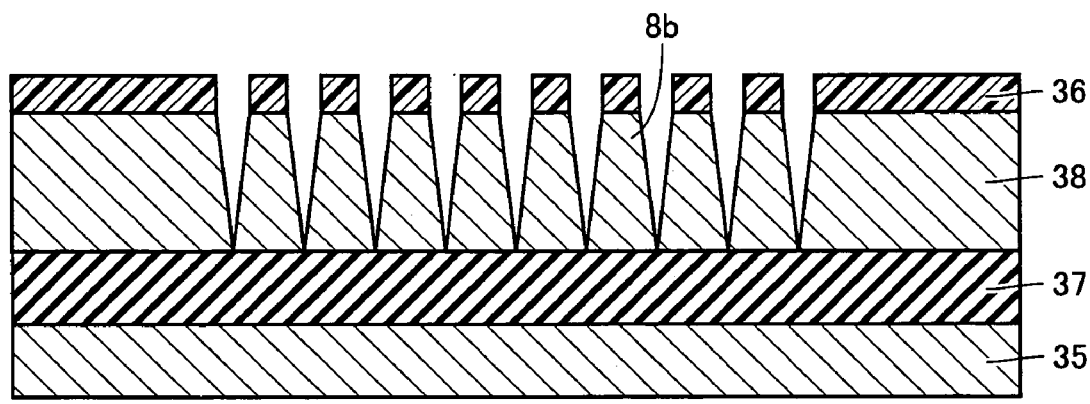
Figure 20:
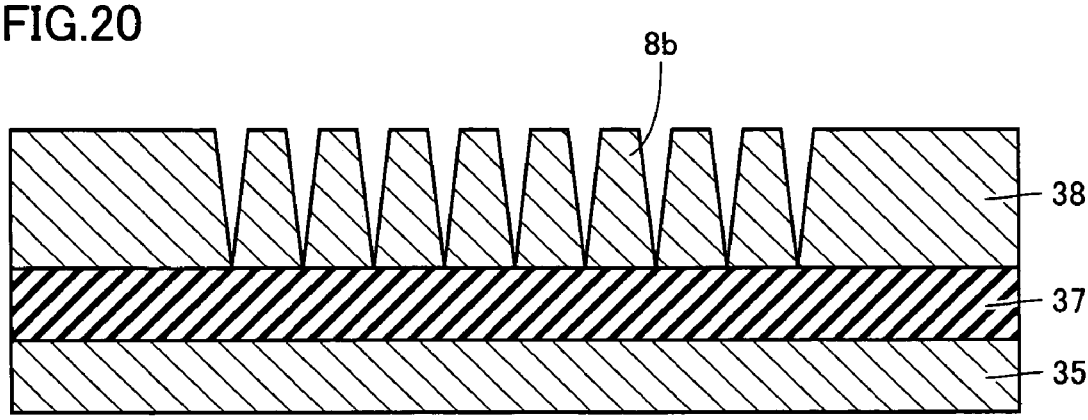

Referring to FIGS. 17 to 20, description will now be given on a second method of manufacturing the irregular reflection film according to the embodiment. As shown in FIG. 17, a silicon oxide film 37 is formed on the upper surface of semiconductor substrate 35. A CVD method or sputtering method is executed to form an amorphous silicon film 38 at the upper surface of silicon oxide film 37. As shown in FIG. 18, resist pattern 36 is formed on the upper surface of amorphous silicon film 38. Opening portions of resist pattern 36 define the regions to be etched. As shown in FIG. 19, anisotropic etching is effected on exposed portions of amorphous silicon film 38 masked with resist pattern 36. The anisotropic etching produces amorphous silicon film 38, in which recesses diverging toward resist pattern 36 are formed. Then, resist pattern 36 is removed as shown in FIG. 20. In this manner, convex portions 8b continuously neighboring to each other are formed at amorphous silicon film 38. Thereafter, the insulating films including the silicon oxide film and the high reflectance portions are formed similarly to the first manufacturing method. In this manner, the irregular reflection film can be formed inside the semiconductor device.

The invention can provide the semiconductor device, which can internally scatter the laser beams, and allows stable recognition of the alignment mark independently of the structure of the semiconductor device.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device comprising:
   an alignment mark arranged on a surface of said semiconductor device, and including a high reflectance portion and a flat low reflectance portion; and
   a refraction film formed internally and provided with a plurality of embedded portions filled with a material different from a material of portions around said embedded portions, wherein
   said embedded portions are formed in at least a portion of a region avoiding a portion shaded by projecting said high reflectance portion onto said refraction film.

2. The semiconductor device according to claim 1, wherein
   said embedded portions penetrate said refraction film, and are arranged regularly when viewed from the side of said high reflectance portion toward said refraction film.

3. The semiconductor device according to claim 1, wherein
   said semiconductor device has a plurality of refraction films.

4. The semiconductor device according to claim 1, further comprising:
   a fuse, wherein
   said alignment mark is formed around a region provided with said fuse.

* * * * *